United States Patent [19]

Matsuo et al.

[11] Patent Number: 5,136,293

[45] Date of Patent: Aug. 4, 1992

[54] DIFFERENTIAL CURRENT SOURCE TYPE D/A CONVERTER

[75] Inventors: Kenji Matsuo; Yasukazu Noine; Kazuhiko Kasai, all of Yokohama, Japan

[73] Assignee: Kabushiki Kaisha Toshiba, Kawasaki, Japan

[21] Appl. No.: 710,119

[22] Filed: Jun. 4, 1991

[30] Foreign Application Priority Data

Jun. 5, 1990 [JP] Japan .................................. 2-145324

[51] Int. Cl.⁵ .................................................. H03M 1/66
[52] U.S. Cl. .................................... 341/144; 341/136; 323/316
[58] Field of Search ................... 341/136, 144, 153; 323/315, 316

[56] References Cited

U.S. PATENT DOCUMENTS

| | | | |
|---|---|---|---|
| 4,306,225 | 12/1981 | Geller et al. | 341/153 |
| 4,405,916 | 9/1983 | Hornak et al. | 341/118 |
| 4,689,549 | 8/1987 | Davis | 323/315 |
| 4,774,497 | 9/1988 | Taylor | 341/118 |
| 4,779,059 | 10/1988 | Taki et al. | 323/316 |
| 4,885,477 | 12/1989 | Bird et al. | 323/316 |
| 5,008,671 | 4/1991 | Tuthill | 341/136 |
| 5,017,919 | 5/1991 | Hull et al. | 341/136 |

*Primary Examiner*—Marc Hoff
*Attorney, Agent, or Firm*—Finnegan, Henderson, Farabow, Garrett and Dunner

[57] ABSTRACT

This invention is a D/A converter including a preset current source, first and second differential switches for selectively deriving an output current of the preset current source in response to complementary signals supplied to control electrodes thereof, and an imaginary short circuit for connecting output portions of current paths of the switches to each other. Variation in the voltage at the time of switching operation of the differential switch can be suppressed by use of the imaginary short circuit with the above construction, thus making it possible to enhance the operation speed.

7 Claims, 3 Drawing Sheets

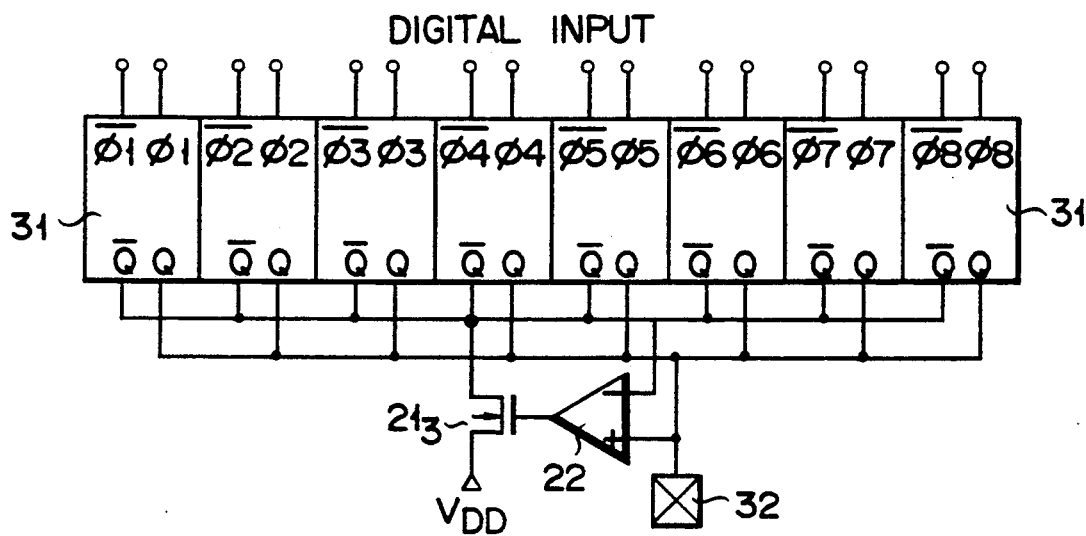
F I G. 6
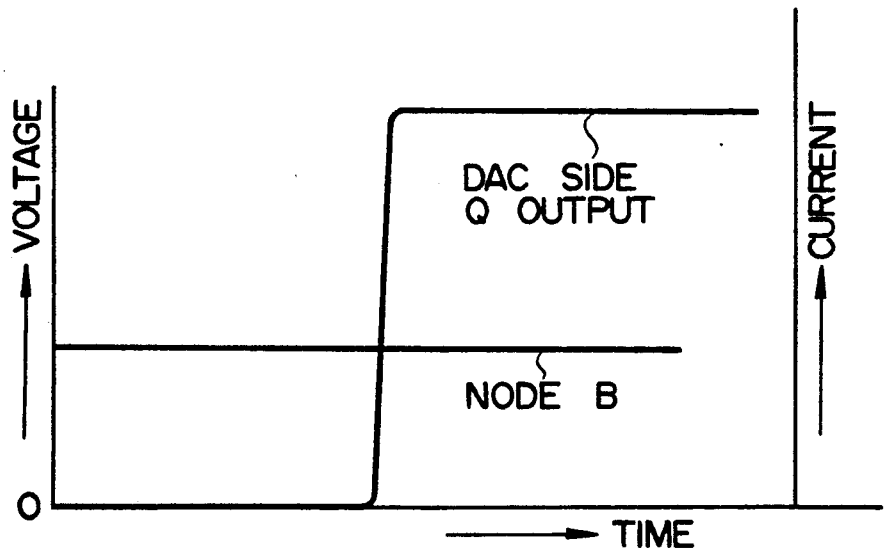
F I G. 7

DIFFERENTIAL CURRENT SOURCE TYPE D/A CONVERTER

BACKGROUND OF THE INVENTION

1. Field of the Invention

This invention relates to a digital/analog (D/A) converter of differential current source type having a preset current source (which is the same as a constant current source) and selectively deriving the output of the current source by means of a differential switch.

2. Description of the Related Art

One unit circuit of an ordinary D/A converter (which is hereinafter referred to as a DAC) constituted by MOS transistors is shown in FIG. 1 as an example of a conventional D/A converter of differential current source type. A multi-bit input DAC comprises a plurality of circuits of the type shown in FIG. 1, whose outputs Q are connected together. In FIG. 1, 11 denotes a preset current source (constant current source), and $12_3$ and $13_3$ denote N-channel MOS transistors constituting differential switches, and the differential switches $12_3$ and $13_3$ are respectively provided on the dummy side and DAC side (DAC output deriving side). The drain of the transistor $12_3$ is connected to a power source VDD, and current outputs Q and $\overline{Q}$ indicate that a current may flow in one of the DAC output deriving path and the dummy path and no current is permitted to flow in the other current path. Control inputs $\phi$ and $\overline{\phi}$ which are in the inverted relationship (complementary relationship) are digital inputs.

The multi-bit input DAC comprises, for example, 16 circuits of the type shown in FIG. 1. This is a 4-bit input DAC. Unlike a ladder resistor voltage dividing system, in this circuit system, a preset current is created according to a reference voltage and current outputs Q and $\overline{Q}$ are derived by turning on one of the differential switches $12_3$ and $13_3$ on the DAC side and dummy side in accordance with a decoded input code, thereby obtaining an output.

The above differential current system has an advantage that one of the current outputs Q and $\overline{Q}$ always flows along one of the current paths. Hence, the constant current will not vary and high speed operation can be attained, provided the outputs Q and $\overline{Q}$ have the same output impedance. However, with the actual device, since the output impedances of portions for the current outputs Q and $\overline{Q}$ are different from each other, a voltage (at a node B) of the preset current source 11 and a current (a Q output on the DAC side) transiently vary as shown in FIG. 2 when one of the current paths for Q and $\overline{Q}$ is changed over to the other current path, and a certain period of time will pass before the voltage at the node B becomes stable, thereby lowering the D/A conversion speed (settling time) and preventing the high speed operation.

In order to solve the above problem, the output terminals are provided on the Q and $\overline{Q}$ sides to make the impedances equal to each other in the prior art, but in this case, the number of terminals is increased, the number of parts used is increased and the cost thereof increases. Further, a means having a previously set impedance in a chip is provided on the $\overline{Q}$ side, but it is almost impossible to actually detect the correct values of an inductance (L), resistor (R) and capacitor (C) given by an externally attached impedance on the Q side and stably mount the impedance.

As described above, in the system in which the constant current is selected and output by means of the differential switch, it is ideal that the current values of Q (DAC side) and $\overline{Q}$ (dummy side) are equal to each other, but the current at the node B will vary when the current path is changed from the $\overline{Q}$ side current path to the Q side current path since the output impedances on the current paths are different from each other.

SUMMARY OF THE INVENTION

An object of this invention is to provide a high-speed D/A converter which comprises a Q switch output section, a $\overline{Q}$ switch output section, and an impedance-adjusting circuit incorporated in the the $\overline{Q}$ switch output section, for adjusting the impedance of this section to the value equal to the impedance of the Q switch output section.

The above object can be attained by a D/A converter comprising a preset current source; first and second differential switches for selectively deriving output currents of the preset current source in response to complementary signals supplied to control electrodes thereof; and an imaginary short circuit which provides a substantial short circuit for connecting output portions of current paths of the switches to each other.

That is, according to this invention, the output portions of the first and second differential switches are set into the imaginary short state by use of a differential amplifier so as to make the impedances of the first and second output sides equal to each other. As a result, since the voltage and current of the node between the preset current source and the differential switch will not transiently vary at the time of switching operation, a high speed D/A conversion can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4 to 6 are circuit diagrams showing circuits according to further embodiments of this invention; and FIG. 7 is a diagram for illustrating the operation of the circuit of FIG. 3.

DETAILED DESCRIPTION OF THE PREFERRED EMBODIMENTS

Figure 1:
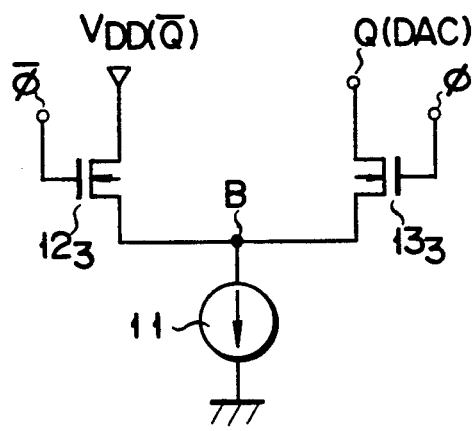
FIG. 1 is a circuit diagram showing a conventional D/A converter of differential current source type.
Figure 3:
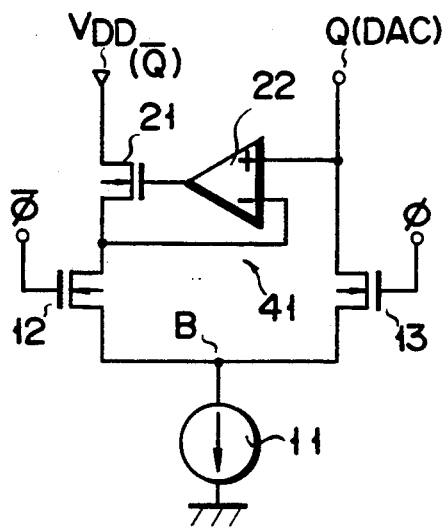
FIG. 3 is a circuit diagram showing a circuit according to one embodiment of this invention.

There will now be described an embodiment of this invention with reference to the accompanying drawings. FIG. 3 is a circuit diagram of a first embodiment, and this embodiment is an example corresponding to the circuit shown in FIG. 1 and portions which correspond to those of the circuit of FIG. 1 are denoted by the same reference numerals. As shown in FIG. 3, one end of a preset current source (constant current source) 11 is grounded and the other end or node B is commonly connected to the sources of N-channel MOS transistors 12 and 13 serving as differential switches. The gates of the transistors 12 and 13 are connected to receive signals $\bar{\phi}$ and $\phi$ as digital inputs set in the complementary relationship. An output impedance adjusting N-channel MOS transistor 21 is connected between the drain of the transistor 12 on the dummy side path and the $\bar{Q}$ output terminal (for example, power source $V_{DD}$) and an output of a differential amplifier 22 is supplied to the control electrode of the transistor 21. A node between the transistors 12 and 21 is connected to a negative input terminal of the differential amplifier 22 and a node between the transistor 13 on the DAC side path and the Q output terminal (DAC output terminal) is connected to a positive terminal of the amplifier 22.

In the circuit of FIG. 3, the drain voltages of the transistors 12 and 13 serving as the differential switches are set equal to each other in the imaginary short state of the differential amplifier 22 so as to adjust the bias voltage of the transistor 21. Therefore, the voltage and current of the node B of the preset current source 11 will not vary at the time of switching operation of the transistors 12 and 13, making it possible to enhance the operation speed.

Figure 4:
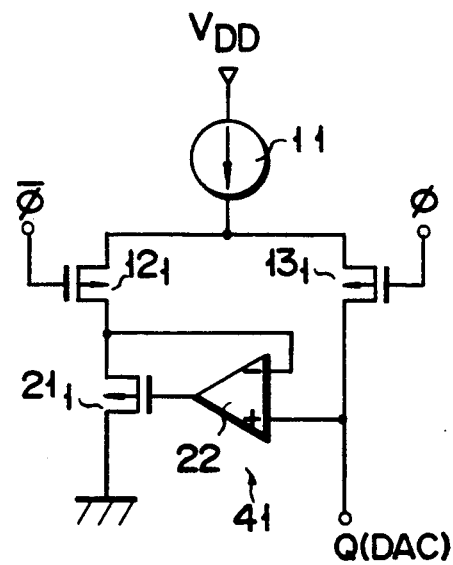
Figure 5:
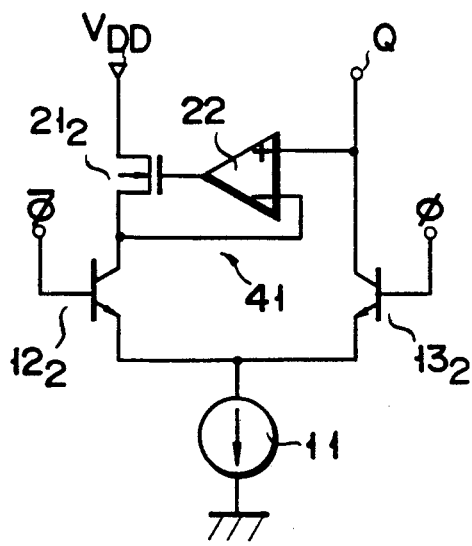

FIG. 3 shows the current drawing type circuit constituted by the N-channel MOS transistors as described above, and FIG. 4 shows a current deriving-out type circuit constituted by P-channel MOS transistors $12_1$, $13_1$, and $21_1$ corresponding to the N-channel MOS transistors of FIG. 3, and FIG. 5 shows a current drawing type circuit formed by use of the bipolar-CMOS technique using bipolar transistors $12_2$ and $13_2$ serving as differential switches and an N-channel transistor $21_2$ serving as an output impedance adjusting element to realize the present invention. The effects and operations of the circuits shown in FIGS. 4 and 5 are the same as that of the circuit shown in FIG. 3, and the output sides of both of the differential switches are set into the imaginary short state by use of the differential amplifier so as to make the impedances of the output sides of the differential switches equal to each other.

FIG. 6 shows a circuit having a plurality of units 31 which have no imaginary short circuit and are equivalent to the DAC of FIG. 1, for example, and in which Q outputs are commonly connected and $\bar{Q}$ outputs are commonly connected. In this example, the total sum output of all of the units is derived at a final output stage by means of the single differential amplifier 22 so as to control a bias voltage applied to the impedance adjusting transistor $21_3$. In this case, 32 denotes a pad from which an analog output is derived and $\phi 1$ and $\bar{\phi}1$ to $\phi 8$ and $\bar{\phi}8$ denote digital inputs corresponding to $\phi$ and $\bar{\phi}$.

Figure 2:
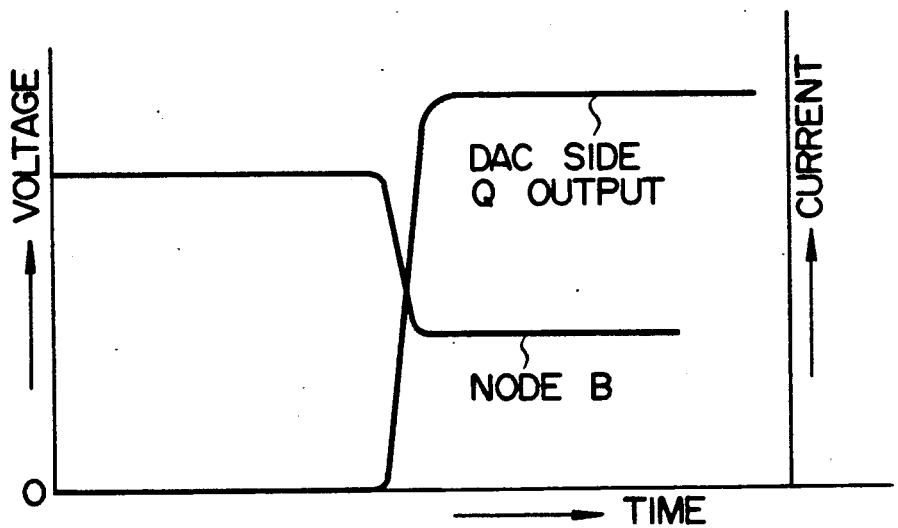
FIG. 2 is a diagram for illustrating the operation of the circuit of FIG. 1.

This invention has the following advantages. The operation of the conventional circuit shown in FIG. 1 is illustrated in FIG. 2. Assuming now that the Q (DAC) terminal has an impedance providing VDD/2 potential thereon, for example, the node B varies as shown in FIG. 2 when the state of the gate input of the differential switch is changed from the state in which $\bar{\phi}$="H" (high level) and $\phi$="L" (low level, thus conductive in the dummy path) to the state in which $\bar{\phi}$="L" and $\phi$="H" (this, conductive in the DAC path). Therefore, time required for the node B to become stable is used as the settling time of the DAC.

On the other hand, for example, the operation of the circuit shown in FIG. 3 is illustrated in FIG. 7. That is, since the impedances of the output sides of the differential switches equal each other in the circuit of FIG. 3, the voltage of the node B is substantially the same as that obtained when a current flows in the DAC path, even if a current flows in the dummy path. Due to there being no changes in the voltage at the node B, no time needs to be spent performing the voltage variation shown in FIG. 2. As a result, the operation speed of the D/A conversion can be further enhanced.

The circuit shown in FIG. 3 has another advantage over the circuit of FIG. 1. Even if the same impedance as that of the DAC side is provided on the dummy side in the chip, it is extremely difficult to add parasitic L, R and C of the lead frame, socket and the like included in the impedance on the DAC side. In this invention, the impedances on both sides can accord easily and accurately to each other by use of the imaginary short circuit 41 of this invention shown in FIG. 3, thereby making it possible to increase the operation speed of the D/A conversion, reduce the occupied area and enlarge the application range thereof.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A differential current source type D/A converter comprising:
    a preset current source;
    first and second differential switches, each with a control electrode and a current path with an output section having an impedance, for extracting an output current by selective switching of complementary signals supplied as digital inputs to the control electrodes;
    circuit means for connecting the output sections to achieve a substantial short circuit, whereby the impedances of the output sections of the current paths of the first and second differential switches are made substantially equal to each other; and
    analog circuit means for extracting an analog output from the output section of the current path of one of the first and second differential switches.

2. A differential current source type D/A converter comprising:
    a preset current source;
    first and second differential switch means, having first and second control electrodes and first and second current paths with respective first and second output sides each having an impedance, for extracting an output current by selective switching of complementary signals supplied as digital inputs to the first and second control electrodes;
    circuit means, including an impedance adjusting element with a third control electrode connected to the first output side, and a differential amplifier with first and second inputs and an output, the first input being connected between the impedance adjusting element and the first differential switch means, the second input being connected to the second output side, and the output being connected to the third control electrode, for achieving a substantial short circuit thereby making the impedances of the first and second output sides equal; and analog circuit means for extracting an analog output from one of the first and second output sides.

3. The differential current source type D/A converter according to claim 1 or 2, wherein said complementary signals are digital inputs and the analog output is derived from the second output side.

4. The differential current source type D/A converter according to claim 1 or 2, wherein said first and second differential switches are formed of MOS transistors which constitute a current drawing type circuit.

5. The differential current source type D/A converter according to claim 1 or 2, wherein said first and second differential switches are formed of MOS transistors which constitute a current deriving-out type circuit.

6. The differential current source type D/A converter according to claim 1 or 2, wherein said first and second differential switches are formed of bipolar transistors which constitute a current drawing type circuit.

7. A differential current source type D/A converter comprising a plurality of differential current source circuits each including:

a preset current source;

first and second differential switch means, each having a control electrode and a current path with an output side having an output side common connection node and an impedance, for deriving an output current of said preset current source by selective switching of complementary signals supplied as digital inputs to the control electrodes;

circuit means, for connecting the output sides of the first differential switch means and the output sides of the second differential switch means, including:

an impedance adjusting element with a control electrode coupled to the output side of the first differential switch means; and a differential amplifier, with first and second inputs and an output, wherein the first input is coupled to a node between the impedance adjusting element and the output side common connection node of the first differential switch means, the second input is coupled to the output side common connection node of the second differential switch means, and the output is coupled to the control electrode of the impedance adjusting element, whereby a substantial short circuit is achieved between the output sides of the first and second differential switch means thereby making the impedances of the output sides of the first and second differential switch means substantially equal; and analog circuit means for extracting an analog output from one of the output sides of the first and second differential switch means.

* * * * *